United States Patent
Chang et al.

(10) Patent No.: US 9,213,233 B2
(45) Date of Patent: Dec. 15, 2015

(54) PHOTOLITHOGRAPHY SCATTERING BAR STRUCTURE AND METHOD

(71) Applicant: Taiwan Semiconductor Manufacturing Company, Ltd., Hsin-Chu (TW)

(72) Inventors: Chia-Cheng Chang, Baoshan Township (TW); Wei-Kuan Yu, Hsinchu (TW); Yen-Hsu Chu, Taipei (TW); Tsai-Ming Huang, Zhubei (TW); Chin-Min Huang, Taichung (TW); Cherng-Shyan Tsay, Toufen Township (TW); Chien Wen Lai, Hsinchu (TW); Hua-Tai Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 203 days.

(21) Appl. No.: 13/941,164

(22) Filed: Jul. 12, 2013

(65) Prior Publication Data

US 2015/0017571 A1 Jan. 15, 2015

(51) Int. Cl.
*G03F 1/38* (2012.01)
*G03F 7/20* (2006.01)

(52) U.S. Cl.
CPC ... *G03F 1/38* (2013.01); *G03F 7/20* (2013.01)

(58) Field of Classification Search
CPC ................ G03F 1/26; G03F 7/20; G03F 1/38
USPC ....................................... 430/5, 311
See application file for complete search history.

(56) References Cited

U.S. PATENT DOCUMENTS

2009/0258302 A1    10/2009   Ho et al.
2011/0143268 A1*   6/2011   Laidig et al. ...................... 430/5

* cited by examiner

*Primary Examiner* — Stephen Rosasco
(74) *Attorney, Agent, or Firm* — Haynes and Boone, LLP

(57) ABSTRACT

Provided is an integrated circuit (IC) photo mask. The IC photo mask includes a main feature of the IC, the main feature having a plurality of sides, and a plurality of assist features, the assist features being spaced from each other and spaced from the main feature, wherein each one of the assist features is adjacent to one of the sides, each one of the assist features has an elongated shape along a direction, whereby extending the shape in the direction would intersect at least another one of the assist features and the assist features are sub-resolution correction features for correcting for optical proximity effect in a photolithography process.

20 Claims, 7 Drawing Sheets

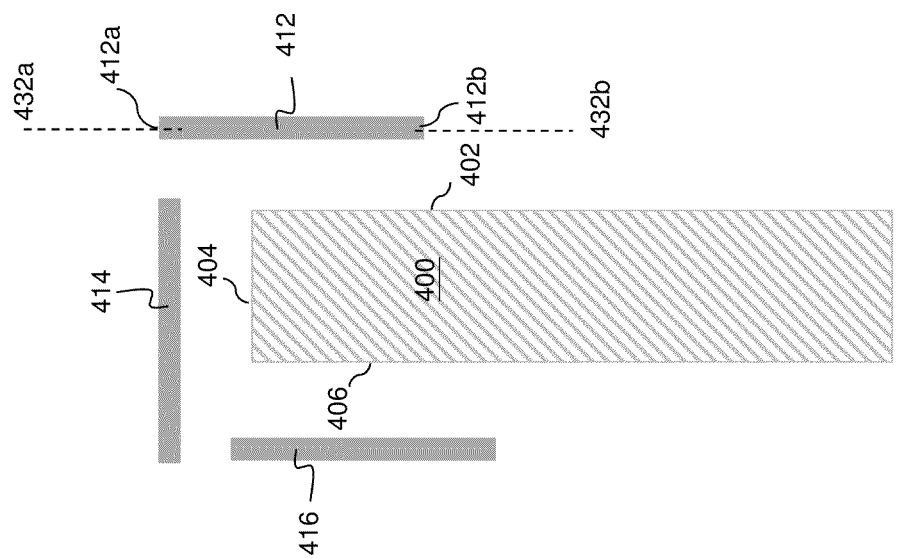

PHOTOLITHOGRAPHY SCATTERING BAR STRUCTURE AND METHOD

BACKGROUND

Photolithography is a process used in semiconductor integrated circuit (IC) device fabrication to produce device structures on semiconductor or other substrates. Distortions of device structures are becoming evident in view of the shrinking of the dimensions of the device structures as compared to the radiation wavelengths used during photolithography. The challenges presented by sub-wavelength photolithography include image distortion in the form of line-end shortenings, corner rounding, isolated/dense proximity effects, and adverse impacts on the depth of focus (DOF). One source of distortion is due to light scattered or otherwise affected by adjacent structures. Distortion in size and shape of the projected image exhibited by this phenomenon is called proximity effect.

In optical proximity correction (OPC), a resolution enhancement technique (RET) using scattering bars, has been introduced to counter proximity effects and to reduce distortion. Scattering bars are sub-resolution assist features (SRAF) that are placed on a mask (also referred to as a reticle or photo-mask) adjacent to isolated features and/or semi-isolated features. Isolated and semi-isolated design features, such as metal lines, trenches, or gate polysilicon, are generally exposed and/or printed on the substrate at a feature size significantly different from the same design feature surround by other nearby features. This phenomenon is known as an isolated/dense proximity effect. The use of scattering bars enables these isolated and/or semi-isolated design features to form similar to how dense features are formed. In this manner, the usable resolution of an imaging system may be extended without decreasing the radiation wavelength or increasing a numerical aperture of the imaging tool, although such processes can be used for additional benefit.

One type of conventional scattering bars is to have narrow lines placed in parallel with and adjacent to edges (or sides) of an isolated design feature. These types of scattering bars are commonly called edge scattering bars (ESB). Edge scattering bars are sometimes used in conjunction with geometry patterns (GP) which are small holes or islands on mask placed oblique to an isolated feature. ESBs and GPs are typically arranged within an area closely surrounding an isolated feature. As such, these assist features are very small in sizes and present challenges for mask fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-5B are simplified graphical representations of embodiments of IC layout with sub-resolution assist features according to various aspects of the present disclosure.

DETAILED DESCRIPTION

Figure 1:
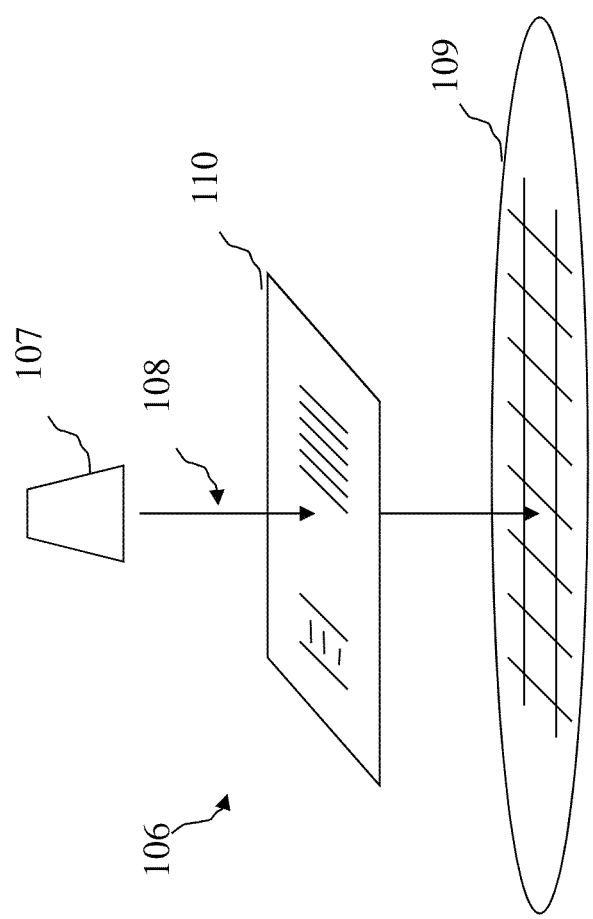
FIG. 1 is a block diagram of a photolithography system that can benefit from one or more embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

In light of the challenges presented by sub-wavelength photolithography, resolution enhancement technologies (RET) have been devised to extend the usable resolution of an imaging system without decreasing the wavelength of the light or increasing the numerical aperture of the imaging tool. RET includes phase-shifting masks, off-axis illumination (OAI), and optical proximity correction (OPC). The present disclosure provides new and unique scattering bars to make isolated and semi-isolated features of a mask print more like features in a dense area of the mask. The term scattering bars refer to both scattering bars and anti-scattering bars. The disclosure herein introduces scattering bars that are placed adjacent to edges of an existing isolated or semi-isolated feature on a mask and are further configured in a tornado-like shape. It is thus referred to as "Tornado Edge Scattering Bar" (TESB). The isolated and semi-isolated features are also referred to herein as "non-dense" features.

FIG. 1 illustrates a simplified photolithography system 106 that can benefit from one or more embodiments of the present disclosure. The photolithography system 106 includes a light source 107 for projecting a radiation 108 onto a substrate 109 through a mask 110. Although not shown, various lenses can also be provided, as well as other light manipulating and/or transmitting devices. The radiation 108 may include an ultraviolet (UV) light, an extreme ultraviolet (EUV) light, an electron beam, an X-ray or an ion beam. In furtherance of the present embodiment, the substrate 109 is a semiconductor wafer for receiving an integrated circuit pattern from the mask 110. The patterns from the mask 110 will appear on a layer of the substrate 109, thereby creating an integrated circuit device, or chip, when combined with other layers.

The mask 110 includes a plurality of design features, some of which are located in densely populated areas of the mask, others of which are located in areas that are not as dense. The mask 110 also includes a plurality of RET features. RET features are sub-resolution features that will not be printed on the wafer, but are placed adjacent a feature that is to be imaged onto a wafer (e.g., a main feature) to improve its imaging.

Figure 2:
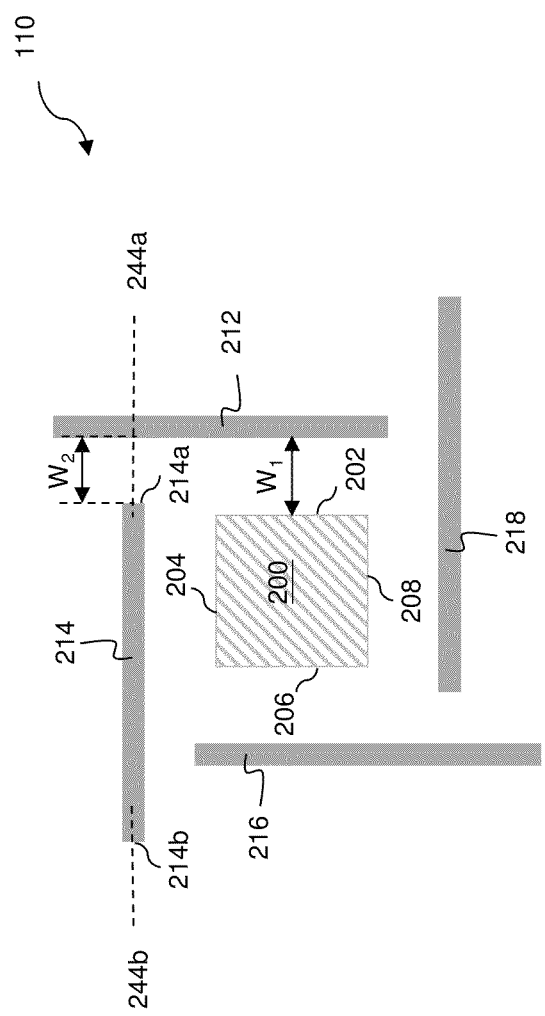

FIG. 2 illustrates an embodiment of the mask 110 according to the present disclosure. The mask 110 includes a main feature 200 and a plurality of tornado edge scattering bars (TESBs), 212, 214, 216 and 218, placed in a configuration according to various aspects of the present disclosure. The configuration of TESBs is described in greater detail below.

The mask 110 may be a binary mask, phase-shift mask including attenuated phase shift mask (attPSM), alternating phase shift masks (altPSM), chromeless phase lithography (CPL), and/or other mask types known in the art. The mask 110 includes a substrate. The substrate may be a transparent substrate such as fused silica ($SiO_2$), or quartz, relatively free of defects, calcium fluoride, or other suitable material.

The main feature 200 may be designed to form a portion of an integrated circuit pattern on a semiconductor substrate, such as a wafer. The main feature 200 may be designed to form an integrated circuit feature such as a contact (e.g., via), an insulating region, a conductive line, a source and/or drain, a gate, a doped region, and/or other possible features. The main feature 200 may be formed of attenuating material disposed on the mask. The attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination therefore. The main feature 200 may be formed using processes including photoresist deposition, soft baking, mask aligning, exposing (e.g., patterning), baking, developing the photoresist, hard baking, stripping the resist, and/or other processes. In alternative embodiments, the lithography patterning may include electron-beam writing, ion-beam writing, mask-less lithography, and/or molecular imprint. Though illustrated as a symmetrical and square feature, the main feature 200 may be of any shape, size, or dimension.

The tornado edge scattering bars (TESBs), 212, 214, 216 and 218, are sub-resolution assist features. In another word, they are of dimensions such that the features will not image onto a semiconductor substrate (e.g., wafer) when the mask is irradiated. The TESBs, 212, 214, 216 and 218, may be formed of attenuating material, be a phase shift feature (e.g., an etched portion of the photo mask substrate), and/or any other feature type providing more efficient or effective imaging of the main feature 200. The TESBs, 212, 214, 216 and 218, may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination therefore. Though illustrated as symmetrical and rectangular, the TESBs, 212, 214, 216 and 218, may include any variation of shape, size, and/or dimension. Further, the shape, dimensions, size, and position of the TESBs, 212, 214, 216 and 218, may be modified during the design and mask making process.

Referring again to FIG. 2, in the present embodiment, the main feature 200 is an isolated feature with four edges (or sides), 202, 204, 206 and 208. Each edge is associated with one of the TESBs that is placed a distance away from the edge. In the present embodiment, the edge 202 is associated with the TESB 212 that is placed a distance $W_1$ away from the edge 202. The distance $W_1$ is in a range approximately in proportion to a resolution limit of the fabrication process known in the art such that the assist feature 212 may contribute to imaging of the main feature 200 onto a substrate. The assist features 214, 216 and 218 are placed similarly in relation to the edges 204, 206 and 208 respectively. Though illustrated as being placed approximately equal distance from the respective edges, each of the assist features can be adjusted closer to or further away from its associated edge.

For each of the sub-resolution assist features in a TESB configuration, such as the assist features, 212, 214, 216 and 218, as illustrated in FIG. 2, one end of the assist feature is placed restrictively a distance from another assist feature, while another end of the assist feature is extended to meet mask creation rules. This one-way extension property is critical in overcoming challenges posed by small conventional scattering bars and geometry patterns.

Referring again to FIG. 2, the assist feature 214 has two ends, 214a and 214b. The end 214a is placed a distance $W_2$ away from the assist feature 212 while the end 214b is extended to meet mask creation rules. The distance $W_2$ conforms to mask creation rules as well as sub-resolution assist feature design rules. For example, the assist features 212 and 214 are to be maintained as two separate sub-resolution assist features during mask creation and IC fabrication. Also illustrated in FIG. 2 are two imaginary lines, 244a and 244b, extending away from the ends 214a and 214b respectively. The two imaginary lines, 244a and 244b, are illustrated for descriptive purposes only and not to imply any feature physically provided on the mask 110. Extending the assist feature 214 along the imaginary line 244a would intersect the assist feature 212 while extending the assist feature 214 along the imaginary line 244b would not intersect any of the assist features, 212, 216 and 218, in the TESB configuration. This provides at least one degree of freedom in designing and fabricating the sub-resolution assist feature 214 in order to conform to mask creation rules while providing enhanced DOF to the main feature 200 on a wafer. The other assist features, 212, 216 and 218, exhibit the same one-way extension property. Being so arranged, the assist features, 212, 214, 216 and 218, form a tornado-like shape, thus comes the name tornado edge scattering bar (TESB).

Though described herein as being provided on the mask 110, the main feature 200 and the TESBs, 212, 214, 216 and 218, are equally illustrative of features and configurations (e.g., layouts) developed in the design of a device, for example, a design of an integrated circuit. For example, the configuration may be represented by data used during the design or fabrication processes, including a layout represented by a design file output, e.g., a GDS output.

Illustrated below are various embodiments of configurations (or layouts) including at least one main feature and at least three sub-resolution assist features provided in a TESB configuration to the main feature. These embodiments may be representative of configurations provided in photo masks, design data including design file output (e.g., GDS output files), and/or other representations of features useful in the design, development, and/or fabrication of devices using photolithography processes. The embodiments provided herein are not intended to be limiting in any manner and are merely exemplary in nature.

Figure 3:
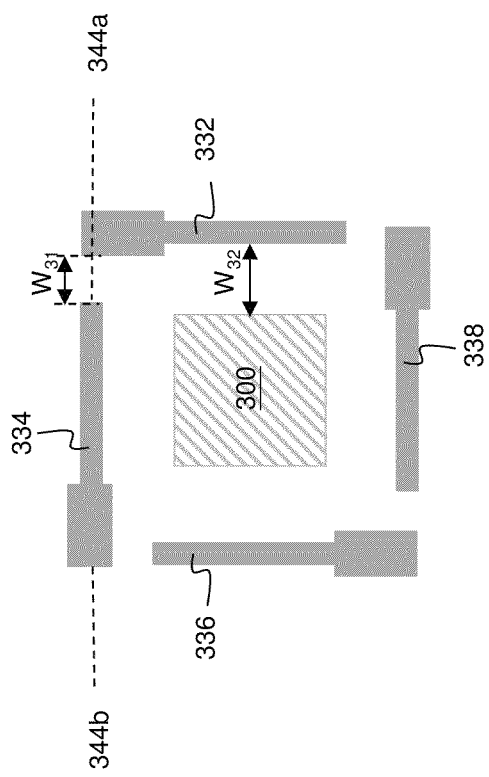

Referring to FIG. 3, in one embodiment, a TESB configuration includes a plurality of sub-resolution assist features (SRAFs), 332, 334, 336 and 338, placed around a main feature 300. The SRAFs have non-uniform shapes, but show the same one-way extension property as aforementioned. For example, extending the SRAF 334 along an imaginary line 344a would intersect the SRAF 332, while extending the SRAF 334 along an imaginary line 344b would not intersect any of the SRAFs, 332, 336 and 338, in the TESB configuration in the present embodiment.

FIG. 4 shows another embodiment according to various aspects of the present disclosure with a main feature 400 and three SRAFs, 412, 414 and 416. Unlike the TESB configurations shown in FIGS. 2 and 3, the SRAFs, 412, 414 and 416, do not enclose the main feature 400. Instead, they are placed adjacent a portion of the main feature 400. As a result, one of the SRAFs, 412, can be extended out of either or both of its ends, 412a and 412b, without intersecting any other SRAFs in the TESB configuration. Therefore, it does not have the one-way extension property. However, all other SRAFs, 414 and 416, have the one-way extension property.

Figure 5B:
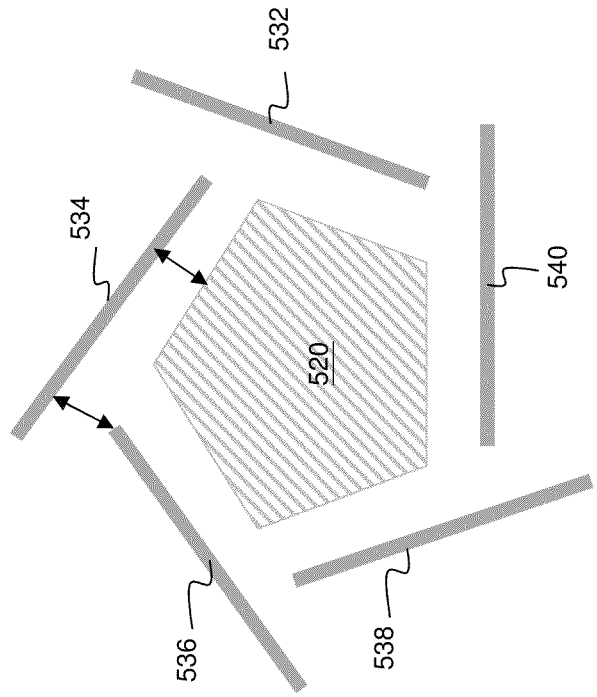
Figure 5A:
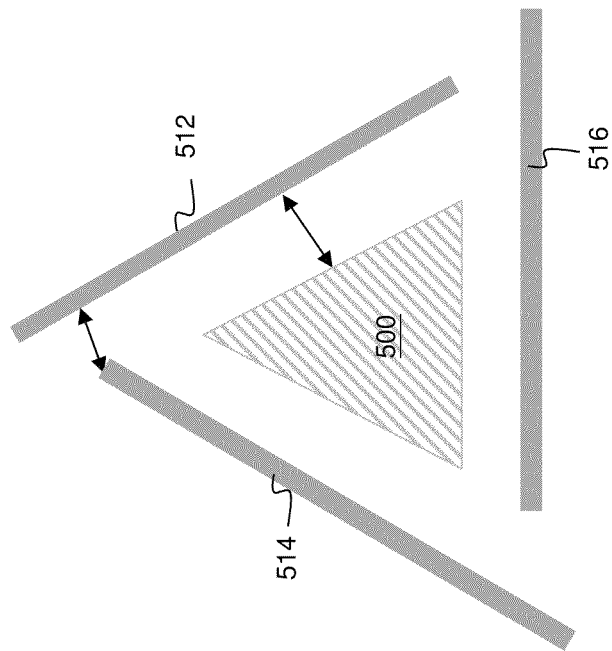

FIGS. 5A and 5B show other embodiments according to various aspects of the present disclosure. FIG. 5A shows a main feature 500 in a triangular shape enclosed by three SRAFs, 512, 514 and 516, arranged in a TESB configuration. FIG. 5B shows a main feature 520 in a pentagon shape enclosed by five SRAFs, 532, 534, 536, 538 and 540, arranged in a TESB configuration.

As thus far illustrated, arranging a plurality of SRAFs around a main feature or a portion of a main feature in a TESB configuration generally provides benefit of increased mask fabrication margins because the plurality of SRAFs are extended in length. In addition, the plurality of SRAFs can be adjusted in their shapes, positions, dimensions, and orientations to increase resolution and precision of the main feature or the portion of the main feature during a photolithography process. One measure of the resolution and precision is by depth of focus (DOF).

Figures 6A, 6B:
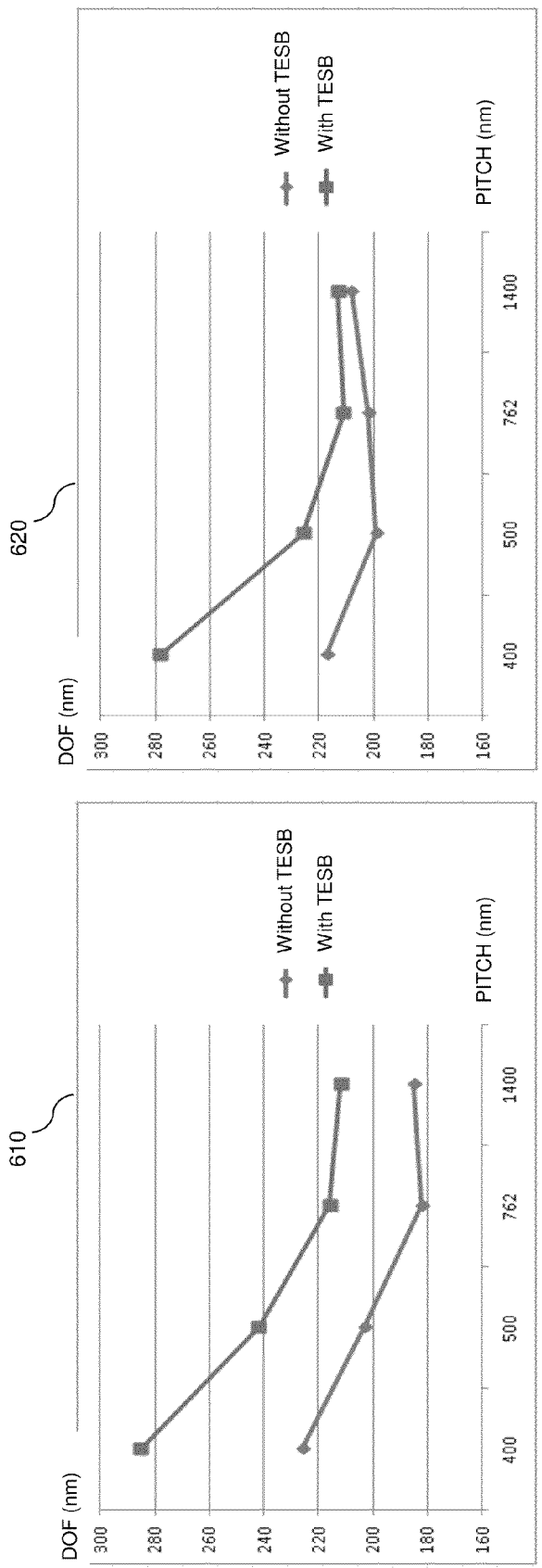
FIGS. 6A and 6B show graphs illustrating an embodiment of improvement of depth of focus (DOF) using configurations according to various aspects of the present disclosure.

Referring now to FIGS. 6A and 6B, graphs 610 and 620 provide for a depth of focus (DOF) at various pitches of a main feature such as, the main feature 200, in a design layout. The graphs 610 and 620 illustrate an improvement in DOF for a given pitch when providing TESBs in the design. The graph 610 corresponds to results simulated with the mask 110, described above with reference to FIG. 2. The graph 620 corresponds to results obtained from semiconductor wafers manufactured with the mask 110, described above with reference to FIG. 2.

Figure 7:
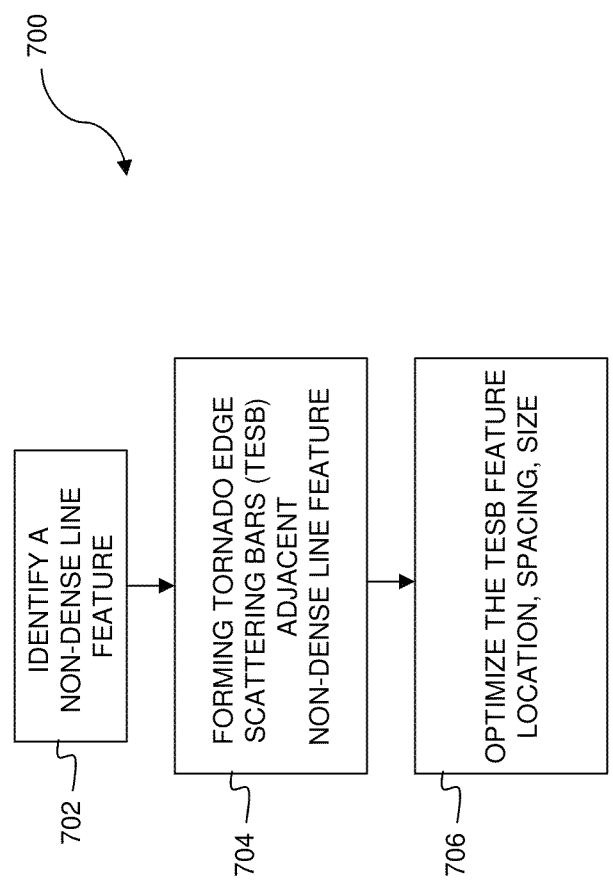
FIG. 7 illustrates a flow chart of an embodiment of a method of providing sub-resolution assist features according to various aspects of the present disclosure.

Referring now to FIG. 7, thus illustrated is a method 700 of providing resolution enhancement techniques including sub-resolution assist features arranged in a TESB configuration around a main feature or a portion of a main feature. The method 700 begins at operation 702 where a plurality of main features is provided. In one embodiment, the main features include an array of IC features, such as a contact, a via, an insulating region, a conductive line, a source and/or drain, a gate, a doped region, and/or other possible features. The main features may be substantially similar to the main feature 200 described above with reference to FIG. 2.

The method 700 (FIG. 7) proceeds to operation 704 where sub-resolution scattering bar features are placed adjacent the main features, with at least a portion of the assist features being arranged in TESB configurations according to various aspects of present disclosure. In one embodiment, the TESBs may be selected and/or placed using a rule-based methodology. In one embodiment, the shape of the TESBs (e.g., rectangular) may be rule based determination. In one embodiment, the size and location of the TESBs may be model-based determinations. The model-based determinations may take into account printing limitations (e.g., mask feature fabrication limitations). In an alternative embodiment, all parameters of the TESBs including shape, size, and position may be rule-based determinations. The TESBs may be substantially similar to the TESBs, 212, 214, 216 and 218, described above with reference to FIG. 2.

The method 700 (FIG. 7) proceeds to operation 706 where the TESBs are optimized. The parameters that may be optimized include position, shape, quantity, size, spacing, and/or various other parameters. The parameters provide for optimizing an arrangement of the layout between the TESBs and/or the main features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an integrated circuit (IC) photo mask. The IC photo mask includes a main feature of the IC, the main feature having a plurality of sides, and a plurality of assist features, the assist features being spaced from each other and spaced from the main feature, wherein each one of the assist features is adjacent to one of the sides, each one of the assist features has an elongated shape along a direction, whereby extending the shape in the direction would intersect at least another one of the assist features and the assist features are sub-resolution correction features for correcting for optical proximity effect in a photolithography process.

In another exemplary aspect, the present disclosure is directed to an integrated circuit (IC) photo mask. The IC photo mask includes a main feature of the IC, the main feature having a plurality of sides, a first assist feature, the first assist feature being spaced from the main feature, and a plurality of second assist features, the second assist features being spaced from each other, spaced from the first assist feature, and spaced from the main feature, wherein the first assist feature is adjacent to one of the sides, each one of the second assist features is adjacent to another one of the sides, each one of the second assist features has an elongated shape along a direction, whereby extending the shape in the direction would intersect at least one of: the first assist feature and at least one of the second assist features, and the first assist feature and the second assist features are sub-resolution correction features for correcting for optical proximity effect in a photolithography process.

In another exemplary aspect, the present disclosure is directed to an integrated circuit (IC) fabrication method. The IC fabrication method includes providing a substrate, the substrate having a photoresist layer and performing a photolithography process to the photoresist layer using a photo mask, the photo mask including a main feature of the IC and a plurality of assist features, wherein the main feature has a plurality of sides, the assist features are spaced from each other and spaced from the main feature, each one of the assist features is adjacent to one of the sides, each one of the assist features has an elongated shape along a direction, whereby extending the shape in the direction would intersect at least another one of the assist features and the assist features are sub-resolution correction features for correcting for optical proximity effect in the photolithography process.

What is claimed is:

1. An integrated circuit (IC) photo mask, comprising:
    a main feature of the IC, the main feature having a plurality of sides; and
    a plurality of assist features, the assist features being spaced from each other and spaced from the main feature;
    wherein:
    each one of the assist features is adjacent to one of the sides;
    each one of the assist features has an elongated shape along a direction, whereby extending the shape in the direction would intersect at least another one of the assist features; and
    the assist features are sub-resolution correction features for correcting an optical proximity effect in a photolithography process.

2. The IC photo mask of claim 1, wherein each one of the assist features is substantially in parallel with one of the sides.

3. The IC photo mask of claim 1, wherein the main feature is substantially square and the plurality of assist features includes four edge scattering bars.

4. The IC photo mask of claim 1, wherein each one of the assist features is symmetrical about an axis.

5. The IC photo mask of claim 1, wherein each one of the assist features is rectangular.

6. The IC photo mask of claim 1, wherein the main feature is a conducting feature of the IC.

7. The IC photo mask of claim 1, wherein at least one of the assist features is generally opaque.

8. The IC photo mask of claim 1, wherein at least one of the assist features is generally transparent.

9. The IC photo mask of claim 1, wherein the photolithography process uses one of:
    an ultraviolet (UV) lithography process, an extreme ultraviolet (EUV) lithography process, an electron beam lithography process, an X-ray lithography process and an ion beam lithography process.

10. An integrated circuit (IC) photo mask, comprising:
    a main feature of the IC, the main feature having a plurality of sides;
    a first assist feature, the first assist feature being spaced from the main feature; and
    a plurality of second assist features, the second assist features being spaced from each other, spaced from the first assist feature, and spaced from the main feature;
    wherein:
    the first assist feature is adjacent to one of the sides;
    each one of the second assist features is adjacent to another one of the sides;
    each one of the second assist features has an elongated shape along a direction, whereby extending the shape in the direction would intersect at least one of: the first assist feature and at least one of the second assist features; and
    the first assist feature and the second assist features are sub-resolution correction features for correcting for optical proximity effect in a photolithography process.

11. The IC photo mask of claim 10, wherein the first assist feature is substantially in parallel with one of the sides and each one of the second assist features is substantially in parallel with another one of the sides.

12. The IC photo mask of claim 10, wherein the first assist feature is symmetrical about an axis and each one of the second assist features is symmetrical about another axis.

13. The IC photo mask of claim 10, wherein the first assist feature is rectangular and each one of the second assist features is rectangular.

14. The IC photo mask of claim 10, wherein the main feature is a conducting feature of the IC.

15. The IC photo mask of claim 10, wherein the photolithography process uses one of: an ultraviolet (UV) lithography process, an extreme ultraviolet (EUV) lithography process, an electron beam lithography process, an X-ray lithography process and an ion beam lithography process.

16. An integrated circuit (IC) fabrication method, comprising:
    providing a substrate, the substrate having a photoresist layer;
    performing a photolithography process to the photoresist layer using a photo mask, the photo mask including a main feature of the IC and a plurality of assist features;
    wherein:
    the main feature has a plurality of sides;
    the assist features are spaced from each other and spaced from the main feature;
    each one of the assist features is adjacent to one of the sides;
    each one of the assist features has an elongated shape along a direction, whereby extending the shape in the direction would intersect at least another one of the assist features; and
    the assist features are sub-resolution correction features for correcting for optical proximity effect in the photolithography process.

17. The IC fabrication method of claim 16, wherein the main feature is a conducting feature of the IC.

18. The IC fabrication method of claim 16, wherein at least one of the assist features is generally opaque.

19. The IC fabrication method of claim 16, wherein the main feature is substantially square and the plurality of assist features includes four edge scattering bars.

20. The IC fabrication method of claim 16, wherein the photolithography process uses one of: an ultraviolet (UV) lithography process, an extreme ultraviolet (EUV) lithography process, an electron beam lithography process, an X-ray lithography process and an ion beam lithography process.

* * * * *